(12) United States Patent
Hahn et al.

(10) Patent No.: US 10,187,030 B2
(45) Date of Patent: Jan. 22, 2019

(54) HIGH QUALITY FACTOR TIME DELAY FILTERS USING MULTI-LAYER FRINGE CAPACITORS

(71) Applicant: Kumu Networks, Inc., Sunnyvale, CA (US)

(72) Inventors: Wilhelm Steffen Hahn, Sunnyvale, CA (US); Alfred Riddle, Sunnyvale, CA (US); Ernie Landi, Sunnyvale, CA (US)

(73) Assignee: Kumu Networks, Inc., Sunnyvale, CA (US)

( * ) Notice: Subject to any disclaimer, the term of this patent is extended or adjusted under 35 U.S.C. 154(b) by 0 days.

(21) Appl. No.: 15/497,167

(22) Filed: Apr. 25, 2017

(65) Prior Publication Data

US 2017/0310296 A1    Oct. 26, 2017

Related U.S. Application Data

(60) Provisional application No. 62/327,011, filed on Apr. 25, 2016.

(51) Int. Cl.
| | |
|---|---|
| *H01G 4/00* | (2006.01) |
| *H03H 7/32* | (2006.01) |
| *H01G 4/232* | (2006.01) |
| *H03H 7/01* | (2006.01) |
| *H01G 4/38* | (2006.01) |
| *H01G 11/82* | (2013.01) |
| *H03H 7/09* | (2006.01) |
| *H01G 4/012* | (2006.01) |
| *H01G 4/228* | (2006.01) |

(Continued)

(52) U.S. Cl.
CPC .............. *H03H 7/32* (2013.01); *H01G 4/232* (2013.01); *H01G 4/38* (2013.01); *H01G 4/385* (2013.01); *H01G 11/82* (2013.01); *H03H 7/01* (2013.01); *H03H 7/0115* (2013.01); *H03H 7/09* (2013.01); *H03H 7/1708* (2013.01); *H03H 7/1775* (2013.01); *H01G 4/00* (2013.01); *H01G 4/002* (2013.01); *H01G 4/005* (2013.01); *H01G 4/01* (2013.01); *H01G 4/012* (2013.01); *H01G 4/018* (2013.01); *H01G 4/228* (2013.01); *H01G 4/30* (2013.01); *H01G 9/008* (2013.01); *H03H 2001/0085* (2013.01)

(58) Field of Classification Search
CPC .. H01G 4/00; H01G 4/30; H01G 4/01; H01G 4/005; H01G 4/002; H01G 4/012; H01G 4/232; H01G 4/228; H01G 4/018; H01G 9/008
USPC ... 361/301.1, 303, 304, 306.1, 306.2, 306.3, 361/312, 330, 504, 538
See application file for complete search history.

(56) References Cited

U.S. PATENT DOCUMENTS

| | | | | | |
|---|---|---|---|---|---|
| 5,583,359 | A | * | 12/1996 | Ng .................... | H01L 23/5223 257/306 |
| 2006/0006496 | A1 | * | 1/2006 | Harris ................ | H01L 23/5223 257/532 |
| 2007/0296013 | A1 | * | 12/2007 | Chang ................ | H01L 23/5223 257/306 |

* cited by examiner

*Primary Examiner* — Binh Tran

(74) *Attorney, Agent, or Firm* — Jeffrey Schox; Thomas Gwinn

(57) ABSTRACT

A multilayer fringe capacitor includes first and second interdigitated capacitor electrodes, both parallel to and intersecting a first planar surface; third and fourth interdigitated capacitor electrodes, the first and second electrodes parallel to and separated by a non-zero distance from the third and (Continued)

fourth electrodes; a first set of coupling vias that electrically couples the first electrode to the third electrode; and a second set of coupling vias that electrically couples the second electrode to the fourth electrode.

13 Claims, 20 Drawing Sheets

(51) Int. Cl.
*H01G 4/30* (2006.01)
*H01G 9/008* (2006.01)
*H01G 4/018* (2006.01)
*H01G 4/002* (2006.01)
*H01G 4/01* (2006.01)
*H01G 4/005* (2006.01)
*H03H 1/00* (2006.01)

C1+C2+C3+C4+C5

$C1+C2+C3+C4+C5 \cong C1+C3+C5$

HIGH QUALITY FACTOR TIME DELAY FILTERS USING MULTI-LAYER FRINGE CAPACITORS

CROSS-REFERENCE TO RELATED APPLICATIONS

This application claims the benefit of U.S. Provisional Application Ser. No. 62/327,011, filed on 25 Apr. 2016, which is incorporated in its entirety by this reference.

TECHNICAL FIELD

This invention relates generally to the analog circuit field, and more specifically to new and useful multi-layer fringe capacitors for high quality factor time delay filters.

BACKGROUND

Time delay elements are used in a variety of analog circuits to cause analog signals to experience a time delay. In particular, time delay elements are important for RF transceivers, where they may be used for amplifier pre-distortion, feed-forward linearization, and active interference cancellation techniques. Of course, such time delay elements may find use in a wide variety of applications involving analog signal transmission, processing, and/or synthesis.

Unfortunately, traditional delay elements (e.g., ceramic filters, SAW filters, coaxial cables, waveguide cavity resonator-based filters) may limit the performance of analog circuits; in particular, RF transceivers, due to one or more of the following problems: excessive size, excessive cost, excessive complexity, poor manufacturability, high loss, or high amplitude ripple or high phase ripple.

Thus, there is a need in the field of analog circuits to create new and useful high quality factor time delay filters. This invention provides such new and useful filters.

DESCRIPTION OF THE INVENTION EMBODIMENTS

The following description of the invention embodiments of the invention is not intended to limit the invention to these invention embodiments, but rather to enable any person skilled in the art to make and use this invention.

As mentioned in the background section, traditional delay elements face a number of issues in integration with RF circuits. One solution to the issues posed by traditional delay elements is found in the LC-resonator-based time delay filters of U.S. patent application Ser. No. 15/382,335, the entirety of which is incorporated by this reference.

The systems described herein may increase performance of full-duplex transceivers (and other applicable systems) by enabling high accuracy time delay filtering without prohibitive increases in circuit complexity and/or cost. Other applicable systems include active sensing systems (e.g., RADAR), wired communications systems, wireless communications systems, channel emulators, duplexer and filter enhancers, reflectometers, PIM analyzers and/or any other suitable system, including communication systems where transmit and receive bands are close in frequency, but not overlapping.

1. Time Delay Filters

Figure 1:
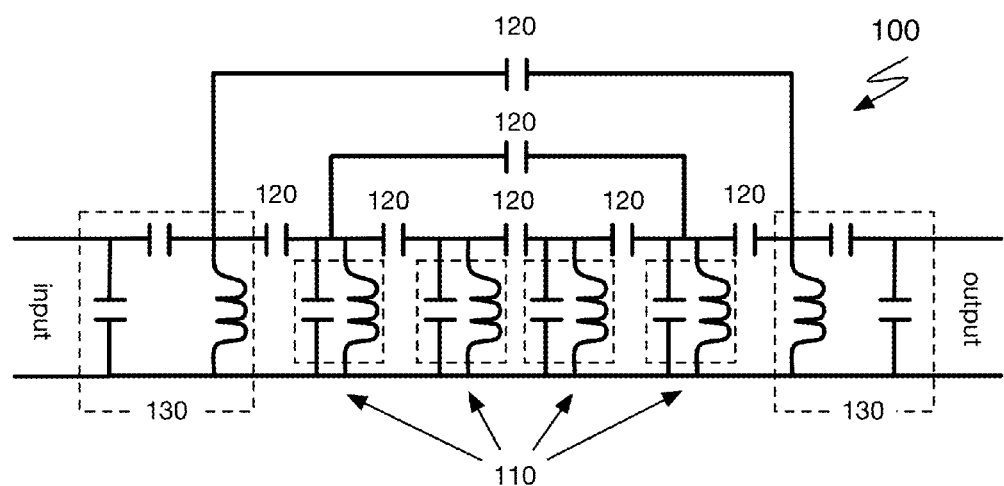
FIG. 1 is a schematic representation of a delay filter of a preferred embodiment.

As shown in FIG. 1, a time delay filter 100 includes a plurality of LC resonators 110. The time delay filter 100 may additionally include intra-filter coupling elements 120 and/or input matching elements 130.

The time delay filter 100 preferably functions to produce a substantially frequency-invariant group delay for analog signals within a particular frequency band of interest; typically a frequency band within the range of radio frequencies (RF), but alternatively any suitable frequency band in any suitable frequency range. A group delay of an analog signal will delay the amplitude envelope of each frequency component of the signal; a frequency-invariant group delay will apply an equal time delay to the amplitude envelope of each frequency component of the signal.

The time delay filter 100 can additionally or alternatively function to increase the performance of signal transceivers (or other applicable systems; e.g., phased antenna arrays) by enabling high accuracy, adjustable, and/or reconfigurable group delay of signals without prohibitive increases in circuit complexity and/or cost.

The time delay filter 100 preferably has a relatively low and frequency-invariant (in a frequency band of interest) insertion loss (e.g., 1 dB, 3 dB, or 5 dB of insertion loss and/or attenuation). In other words, the magnitude of the frequency response of the time delay filter 100 is substantially flat over the range of frequencies of interest (e.g., over the range of radio frequencies) and has a magnitude ripple that is small relative to the signal magnitude (e.g., 10×, 100×, or 1000× smaller). Alternatively, the time delay filter 100 may have any suitable insertion loss, that varies with frequency in any suitable manner.

The time delay filter 100 preferably is constructed from lumped and/or distributed inductors and capacitors that are integrated into the substrate of a laminate (e.g., a printed circuit board), of a microchip (e.g., a silicon substrate), or any other suitable circuit substrate. Integration of the time delay filter 100 may substantially reduce cost and size of the time delay filter 100.

Portions of the time delay filter may additionally or alternatively be added to the substrate as discrete components. For example, the LC resonator(s) 110 of the time delay filter 100 may be integrated into the substrate, and input matching element(s) 130 and/or intra-filter coupling element(s) 120 may be coupled to the substrate and/or the LC resonators as discrete components (e.g., via wire bonding, surface mounting, etc.).

The time delay filter 100 is preferably implemented using analog circuitry, but additionally or alternatively may be implemented by digital circuitry or any combination of analog and digital circuitry. Analog circuitry is preferably implemented using a combination of the circuit substrate and metallized/conductive layers as described above, but can additionally or alternatively be implemented using analog integrated circuits (ICs) and/or discrete components (e.g., capacitors, inductors, resistors, transistors), wires, transmission lines, transformers, couplers, hybrids, waveguides, digital components, mixed-signal components, or any other suitable components. Digital circuitry is preferably implemented using a general-purpose processor, a digital signal processor, an application specific integrated circuit (ASIC), a field programmable gate array (FPGA) and/or any suitable processor(s) or circuit(s). The time delay filter 100 is preferably preconfigured structurally to provide a given time delay or set of time delays, but may additionally or alternatively include memory to store configuration data, or be configured using externally stored configuration data or in any suitable manner.

The time delay filter 100 may include multiple coupling points 113 (i.e., points at which other circuits may couple to the time delay filter 100) to enable either or both of variable impedance of the time delay filter and variable delay of the time delay filter (as discussed in subsequent sections).

The time delay filter 100 may also alter impedance or delay of the time delay filter 100 through use of tunable elements in the LC resonators 110 or matching elements 130; i.e., as opposed to modifying impedance by coupling at a different coupling point, impedance may be modified using variable capacitors and/or inductors.

Each LC resonator 110 of the delay 100 functions to contribute a time delay to an input signal of the time delay filter 100. As shown in FIG. 1, LC resonators 110 are preferably coupled in parallel; alternatively, LC resonators 110 may be coupled in any manner.

LC resonators 110 preferably include one or more coupling points 113, at which other components of the time delay filter (e.g., additional resonators 110, matching elements 130, coupling elements, etc.) are coupled (e.g., electrically connected) to the resonator. Coupling may be resistive (e.g., by a wire, metallized layer, or any other suitable conductive material), capacitive (e.g., by a discrete capacitor, mutual capacitance, etc.), inductive (e.g., by a discrete inductor, mutual inductance, etc.), electromagnetic (e.g., radiative coupling), or any other suitable manner. Additionally or alternatively, LC resonators may be coupled to in any suitable manner.

The LC resonator 110 is preferably optimized to reduce the number of components required in time delay filter construction (and therefore complexity/cost of any applicable system using a time delay filter) as well as to provide low insertion loss. Alternatively, the LC resonator 110 may be optimized or otherwise configured in any manner.

Each LC resonator 110 preferably has substantially the same frequency response and produces a substantially similar time delay. Accordingly, the delay of the time delay filter is preferably approximately equal to the number of LC resonators no multiplied by the average time delay of the LC resonators no. Alternatively, each LC resonator 110 may have any impedance and/or any time delay, and the time delay filter 100 may have any input/output impedance and total time delay. In such an implementation, the total delay experienced by a signal passing through the time delay filter may be adjustable by selecting the number of LC resonators no switched into the signal path. Alternatively, the time delay filter may have a number of LC resonators with different frequency responses that may produce different time delays, and in such cases the delay of the time delay filter is preferably approximately equal to the sum of the time delay of each LC resonator 110 in the signal path. Alternatively, each LC resonator no may have any impedance and/or any time delay, and the time delay filter 100 may have any input/output impedance and total time delay, adjustable in any suitable manner.

Each LC resonator 110 preferably includes a substantially capacitive element (i.e., an element whose reactance, in a frequency band of interest, is negative) and a substantially inductive element (i.e., an element whose reactance, in a frequency band of interest, is positive) placed in parallel. Alternatively, each LC resonator 110 may include any circuit elements such that the impedance of the resonator 110 is approximately characterized by:

$$Z(\omega) = -jk\frac{\omega}{\omega^2 - \omega_0^2}$$

where k is a constant (in a pure LC circuit, $$k = \frac{1}{C}\Big)$$

and $\omega_0$ is the resonant frequency of the resonator (in a pure LC circuit, $$\omega_0 = \frac{1}{\sqrt{LC}}\Big).$$

Alternatively, the LC resonator may include circuit elements that are networked together to provide any suitable total impedance that varies as a function of frequency in any suitable manner.

The LC resonator 110 is preferably constructed in a laminate or chip substrate from a combination of metallization layer strips (e.g., strip inductor, microstrip, etc.), vias (e.g., through-hole vias, partial vias, buried vias, metallized slots, etc.), and the substrate itself. Additionally, the LC resonator 110 may include high-k dielectric layers. Alternatively, the LC resonator 110 may be constructed using any suitable materials.

Figure 2A:
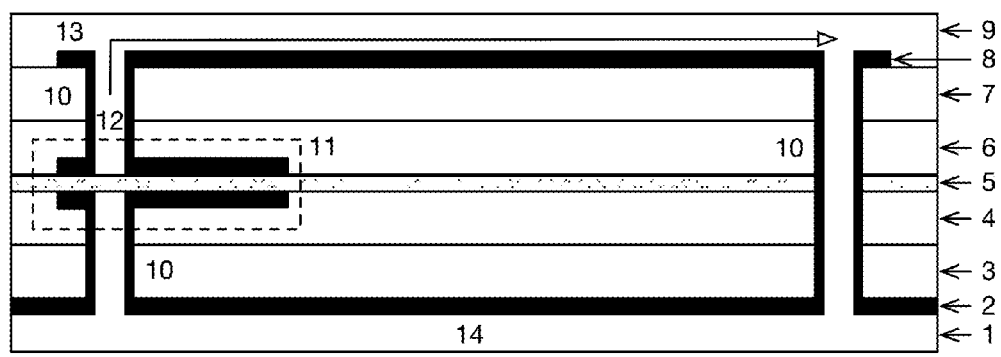
FIG. 2A is a cross-sectional example representation of a resonator of a delay filter of a preferred embodiment.
Figure 2B:
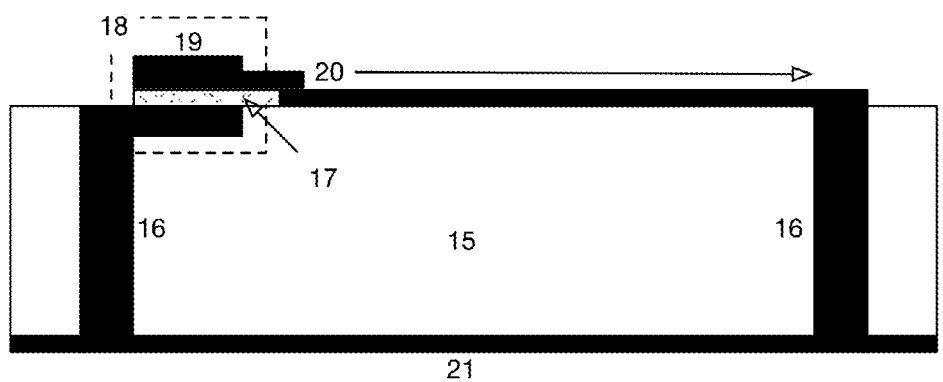
FIG. 2B is a cross-sectional example representation of a resonator of a delay filter of a preferred embodiment.
Figure 3:
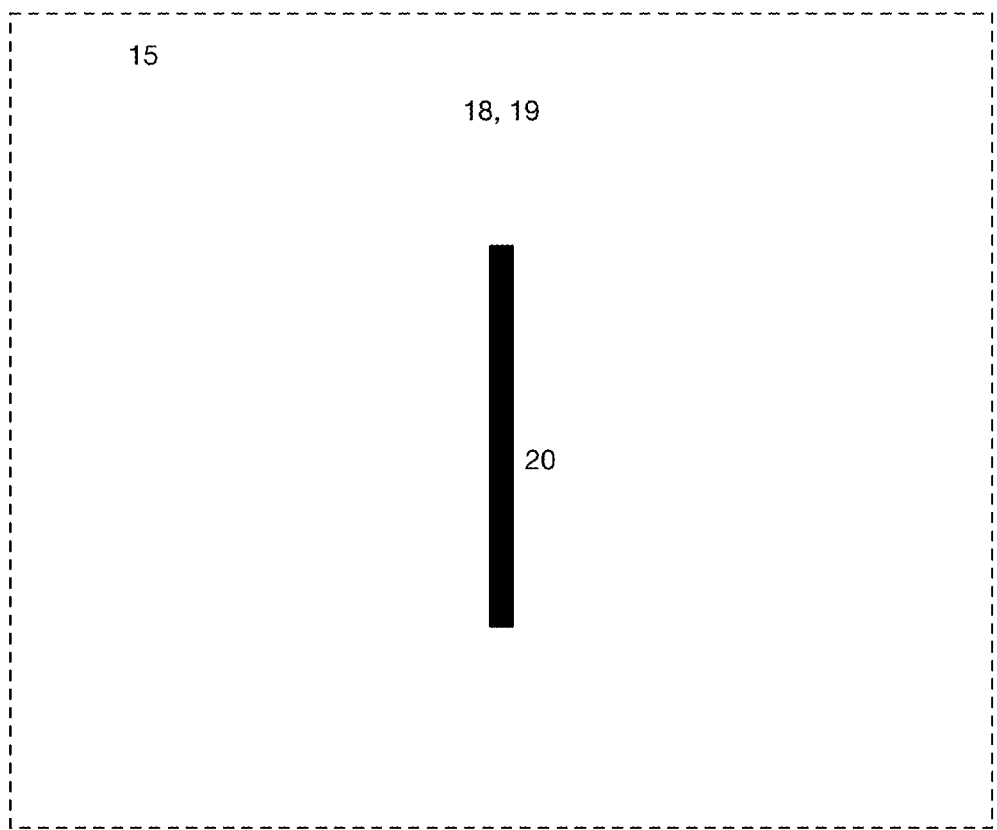
FIG. 3 is a top-down example representation of a resonator of a delay filter of a preferred embodiment.

As shown in FIGS. 2A, 2B, and 3 the LC resonator 110 is preferably constructed from a combination of a parallel plate capacitor and a strip inductor on a laminate substrate or a semiconductor/insulator chip substrate. Such a parallel plate capacitor preferably includes a first conductive planar region separated from a second conductive planar region by a dielectric material, and the first and second conductive planar regions are preferably substantially parallel (e.g., as uniformly parallel as manufacturing tolerances may permit); however, a parallel plate capacitor may additionally or alternatively include any suitable subcomponents configured in any suitable manner. Alternatively, the LC resonator 110 may be constructed from any other suitable capacitive/inductive elements (e.g., a spiral inductor or interdigitated finger capacitor). For example, an LC resonator 110 may include a braided inductive element (i.e., an inductive element comprising several inductive subelements in parallel, separated by an insulator, 'braided' or otherwise positioned near each other). Such a braided inductive element is preferably formed from layers of the substrate including regions of alternately isolative and conductive material, which, when stacked together to form the substrate, are configured into a three-dimensional braided structure. Alternatively, a braided inductive element may be formed from any suitable materials, in any suitable manner.

An example implementation of a preferred embodiment is shown in FIG. 2A (cross-sectional view). In this implementation, the LC resonator 110 is constructed on a laminate substrate, having a number of isolative layers (1, 3-7, 9) and conductive layers (2, 8). The LC resonator 110 is formed from a parallel plate capacitor 11, of which a first plate is coupled to a ground plane 14 by a conductive via 10, and a strip inductor 12, which is coupled to the second plate of the capacitor 11 by a conductive via 10 and is coupled to the ground plane 14 by another conductive via 10. The ground plane may extend over all or most of the surface of the substrate on one side, and thus extend over a greater area than the strip inductor; alternatively, the ground plane may be a second strip inductor on the opposing side of the substrate that is of substantially the same size and extent, or may alternatively extend over any other suitable area. The resonator 110 may be coupled to at coupling point 13. If constructed on a laminate substrate, the LC resonator 110 may include any number of layers made of any material. For example, in this example implementation, the resonator 110 may include epoxy prepreg layers 4 and 6; FR-4 core layers 3, 7; copper conductive layers 2, 8; and hafnium oxide high-k dielectric layer 5, with copper vias 10. The layers, vias, and elements may be of any shape, size, thickness, etc. Note that in particular the dielectric material separating the plates of the capacitor (in this case layer 5) may be a standard isolative layer (e.g., a core layer), but may alternatively be a different dielectric material (e.g., a dielectric material with higher k or otherwise suitable to serve as an insulator for the capacitor 11).

A second example implementation of a preferred embodiment is as shown in FIG. 2B (cross-sectional view) and FIG. 3 (top-down view). In this implementation, the LC resonator 110 is constructed on a semiconductor chip substrate 15. The LC resonator 110 is formed from a parallel plate capacitor 18 and a strip inductor 20, both coupled to a ground contact 21 by through-substrate vias 16. The resonator no may be coupled to at coupling point 19. If constructed on a semiconductor or insulator chip substrate, the resonator 110 may include any materials fabricated in any manner. For example, in this example implementation, the resonator 110 may include a silicon dioxide substrate 15, a silicon dioxide or silicon nitride capacitor dielectric pad 17, with metallic pads/traces/vias fabricated using electroplated copper or aluminum (16, 18-21; note: seed layer not pictured). Similar to the first example implementation, the capacitor dielectric may be a similar material to the substrate or may be a different material (for fabrication reasons, dielectric constant, etc.).

In a third example implementation of a preferred embodiment related to the second example implementation, the LC resonator is constructed on a semiconductor chip substrate, and the LC resonator 110 is formed from a buried parallel plate capacitor and a strip inductor. The strip inductor may be covered by an isolative layer and/or a shielding layer, which may prevent electromagnetic coupling between the strip inductor and neighboring packaged elements (e.g., strip inductors, traces, etc.). Additionally or alternatively, the resonator may be physically distanced from other packaged elements to avoid mutual electromagnetic coupling (in such example implementations and variations where mutual electromagnetic coupling is not desired).

LC resonators 110 may include multiple tapping points to enable modification of the impedance of the LC resonator 110 (as seen by coupled or matching circuits). Tapping points may also be referred to as coupling points, and may perform the same function; alternatively, they may perform different functions. Additionally or alternatively, tapping of the resonator may be used to modify impedance, time delay, resonance frequency, etc.

Figure 4A:
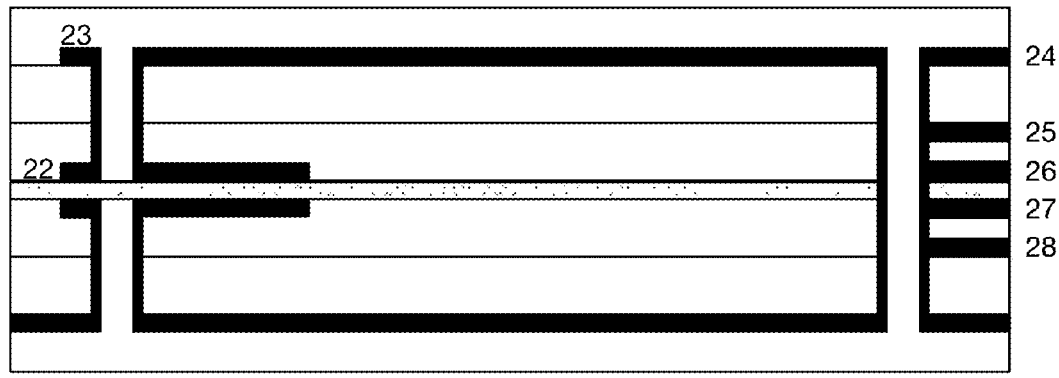
FIG. 4A is a cross-sectional example representation of a resonator of a delay filter of a preferred embodiment.
Figure 4B:
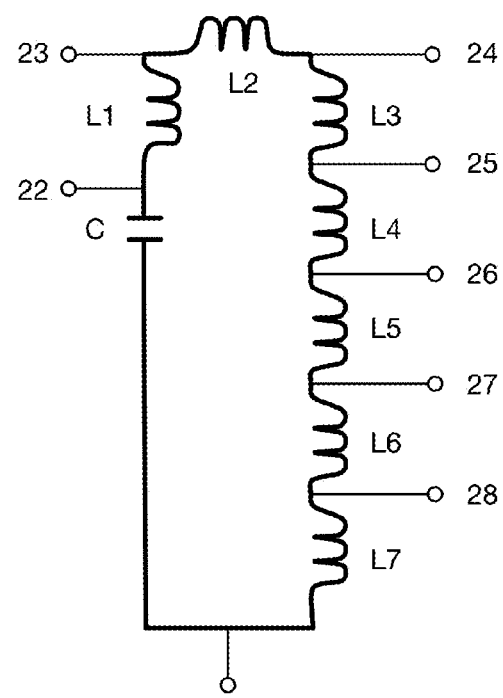
FIG. 4B is a circuit representation of a resonator of a delay filter of a preferred embodiment.

For example, as shown in FIG. 4A, the inductor of the LC resonator 110 may include multiple tapping points 22-28. An equivalent circuit of this example is as shown in FIG. 4B. A tapping point of an inductor or inductive element may include conductive layers of the substrate that extend to a point along a portion of the inductor that passes through the substrate (e.g., to a point along a via that comprises a portion of the resonator). In this example, the inductance of the total inductor (as seen by a coupling element or experienced by a signal passing through the resonator) is variable depending on the point along the conductive path at which a signal is sampled from, or, similarly, the point at which a tap is physically and electrically coupled to the conductive path. The inductance, and thus the frequency response and/or time delay, may be varied by sampling the signal (or coupling to the resonator) at various tapping points.

Figure 5A:
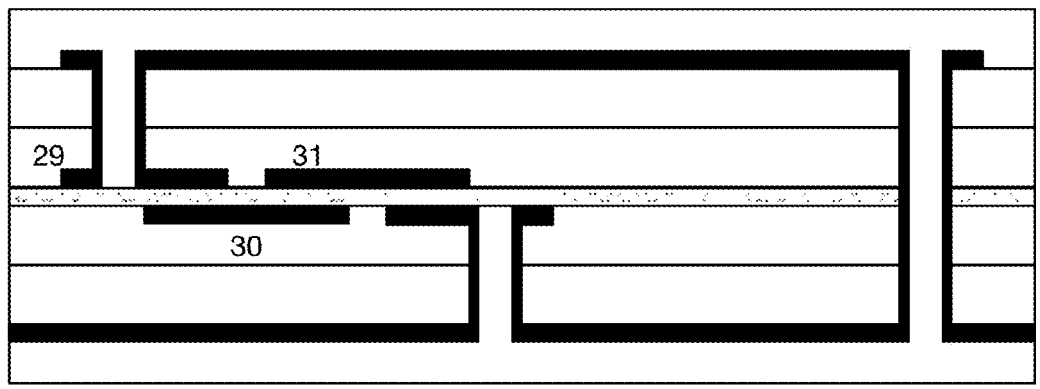
FIG. 5A is a cross-sectional example representation of a resonator of a delay filter of a preferred embodiment.
Figure 5B:
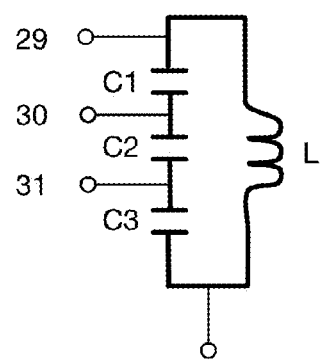
FIG. 5B is a circuit representation of a resonator of a delay filter of a preferred embodiment.

As another example, as shown in FIG. 5A, the capacitor of the LC resonator 110 may include multiple tapping points 29-31. An equivalent circuit of this example is as shown in FIG. 5B. In example implementation, the capacitor includes two conductive planar regions that are subdivided into electrically isolated subregions, as shown in FIG. 5A. Each of these subregions is coupled to a tapping point, and the division of the capacitive element into multiple capacitive subelements in this manner can enable variation of the capacitance of the LC resonator as seen by coupled elements or signals passing through the LC resonator (by variation of the tapping point at which elements are coupled to the multi-tapped LC resonator). Selection of the variable capacitance is preferably performed in a similar manner as for a multi-tapped inductor as described above, but can additionally or alternatively be performed in any suitable manner.

Multiple tapping points allow for either varying the impedance of the resonator and/or generating a differential signal from a single ended input signal (e.g. when using both tapping points around C2 in FIG. 5B). An LC resonator 110 may include multiple tapping points on both the capacitive element and the inductive element.

If a component of an LC resonator 110 includes multiple tapping points, they may be coupled to in any manner. For example, a switch (e.g., a transistor) may be coupled between a resonator 110 input and multiple tapping points, enabling a selection of tapping points. As another example, a switch may be coupled between tapping points, allowing those tapping points to be shorted (e.g., a switch between tapping points 30 and 31 could enable selective shorting of C2).

If a component of an LC resonator 110 includes multiple tapping points and a coupling point at which it is coupled to other LC resonators (e.g., resistively coupled, capacitively coupled, inductively coupled, electromagnetically coupled), they may be selectively coupled in any suitable manner. For example, a set of switches (e.g., transistors, a multi-input/single-output multiplexer, etc.) may be coupled between the tapping points (taps) and the coupling point, enabling selection and/or adjustment of the impedance of the resonator as seen by components (e.g., resonators 110, matching elements 130) coupled to the coupling point.

Figure 6A:
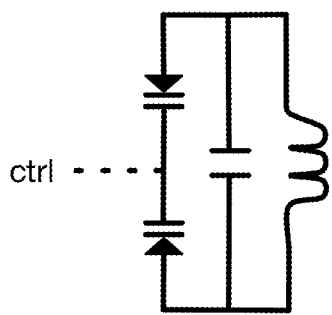
FIG. 6A is a circuit representation of a tunable resonator of a delay filter of a preferred embodiment.
Figure 6B:
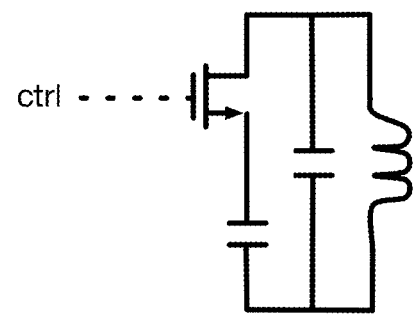
FIG. 6B is a circuit representation of a tunable resonator of a delay filter of a preferred embodiment.

In addition to having tapping points, LC resonators 110 may integrate or be coupled to tunable circuit elements (e.g., capacitors, inductors, transistors, resistors) to change their tuning properties. Some examples of tunable LC resonators no are as shown in FIGS. 6A and 6B. As shown in FIG. 6A, the LC resonator 110 may include one or more varactors in parallel with the LC resonator no, enabling a tunable capacitance of the resonator. As shown in FIG. 6B, the LC resonator 110 may include a single or multitude of capacitor-transistor series combinations, which allow tuning of the capacitance of the LC resonator 110 via different permutations of transistors being switched on or off. In another embodiment the capacitor in the capacitor-transistor series combination may be replaced with a varactor to reduce the number of switches needed or increase the resolution of the tuning.

Tuning of the LC resonators (and hence the delay filter) may also be done permanently at the end of the manufacturing process by adding (e.g. by way of 3D metal printing) or removing (e.g. milling) material from traces, inductor or the plate of any capacitor in the circuit. Alternatively capacitors and/or inductors may be tuned by blowing small fuses implemented as traces in the substrate.

As previously described, LC resonators no of the delay filter 100 are preferably coupled in parallel to form the delay filter 100 (or part of the delay filter 100). While LC resonators no may be coupled in any manner (e.g., resistively), LC resonators no are preferably coupled to each other capacitively (using capacitive intra-filter coupling elements 120) and/or inductively (by positioning inductors of LC resonators 110 to enable magnetic coupling between the inductors) or in any combination of the 3 coupling methods (e.g. 50% capacitive and 50% inductive).

Intra-filter elements 120 function to couple LC resonators 110 of the delay filter 100. Similarly to components of the LC resonator 110, intra-filter elements are preferably passive capacitive, resistive, and/or inductive elements, but intra-filter elements may be any active or passive components capable of coupling LC resonators 110. Intra-filter elements 120 are preferably constructed from a combination of metallization layer strips, vias, and the substrate, but may additionally or alternatively be constructed in any manner. For example, a capacitive intra-filter element 120 may be a packaged capacitor surface-mounted to a substrate containing the LC resonators 110. As another example, a capacitive intra-filter element 120 may be constructed in a substantially similar manner to a capacitor of an LC resonator 110.

Figure 7A:
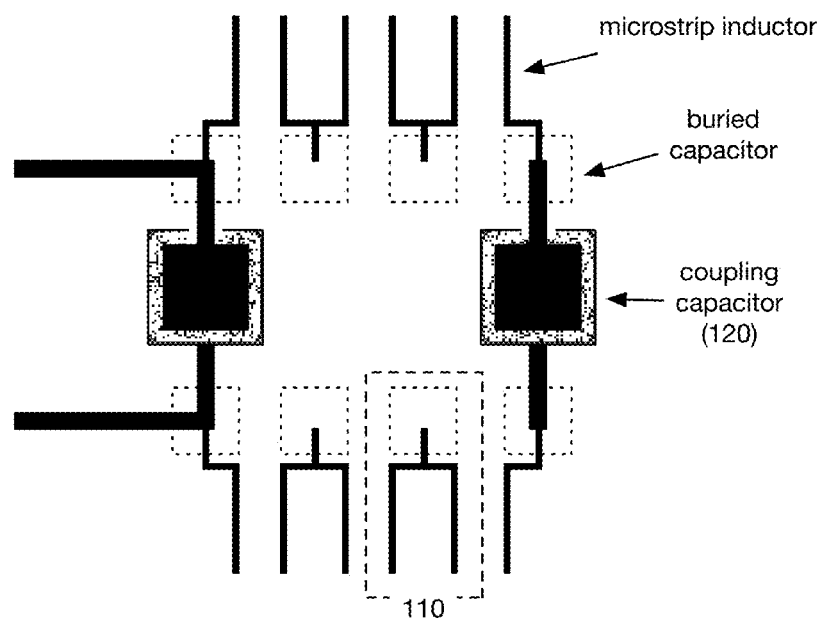
FIG. 7A is a top-down example representation of a delay filter of a preferred embodiment.
Figure 7B:
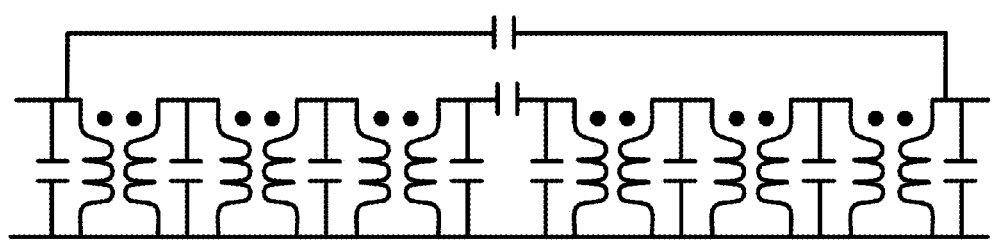
FIG. 7B is a circuit representation of a delay filter of a preferred embodiment.

As shown in a top-down view in FIG. 7A, an example delay filter 110 includes LC resonators 110 coupled both capacitively and inductively. An equivalent circuit model is as shown in FIG. 7B. In this example, the coupling capacitors are mounted to the surface of the substrate whereas the buried capacitors associated with each LC resonator are embedded within the substrate. Alternatively, the coupling capacitors may be similarly embedded, or may be otherwise suitably configured. In this example, the microstrip inductors of a subset of the resonators include two distinct conductive regions that extend across a surface of the substrate, and are separated laterally on the surface. Inductive coupling (e.g., by way of mutual inductance) between resonators is accomplished in this example by one of the laterally-separated portions of the inductor of one resonator coupling with one of the portions of the inductor of another resonator. The bilateral configuration of this example provides for inductive coupling with a resonator positioned at either lateral position neighboring the resonator.

Figure 8A:
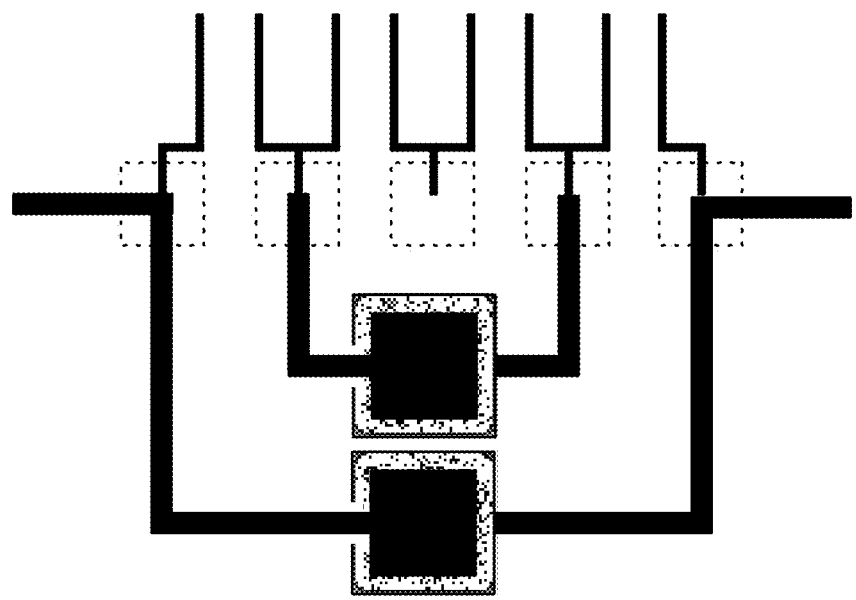
FIG. 8A is a top-down example representation of a delay filter of a preferred embodiment.
Figure 8B:
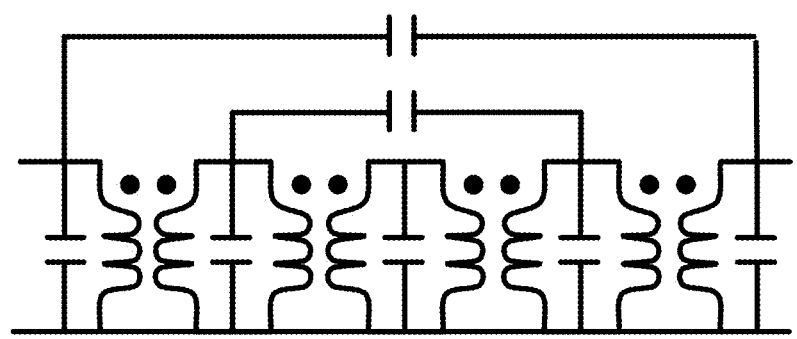
FIG. 8B is a circuit representation of a delay filter of a preferred embodiment.

As shown in a top-down view in FIG. 8A, a second example delay filter 110 also includes LC resonators 110 coupled both capacitively and inductively. An equivalent circuit model is as shown in FIG. 8B.

Inductive coupling is preferably accomplished by placing microstrip inductors in proximity to each other, but may additionally or alternatively be accomplished in any manner. For example, inductors of separate LC resonators 110 may be braided or otherwise positioned to accomplish inductive coupling between the LC resonators no. Note that inductive coupling may include electromagnetic coupling between inductors that are not in direct electric contact (e.g., the changing magnetic flux generated by current flowing through one inductor or inductive element may induce a current in another inductor or inductive element); it may additionally or alternatively include direct electrical coupling of an inductor between two inductors, that are thereby inductively coupled.

Input matching elements 130 function to couple LC resonators 110 to an input and/or output of the delay filter 100 with the desired impedance. Input matching elements 130 preferably include circuits comprising passive capacitive, resistive, and/or inductive elements, but input matching elements 130 may be any active or passive combination of components (including trace or microstrip components) capable of coupling the delay filter 100 to an external circuit. Input matching elements 130 are preferably constructed from a combination of metallization layer strips, vias, and the substrate, but may additionally or alternatively be constructed in any manner. For example, an input coupling element 130 may comprise a circuit of packaged capacitors and inductors surface-mounted to a substrate containing the LC resonators 110. As another example, components of an input coupling element 130 may be constructed in a substantially similar manner to those of an LC resonator 110. Similar to LC resonators 110, input matching elements 130 may incorporate tapped or otherwise tunable capacitive and/or inductive elements. In another embodiments the input coupling element may incorporate tunable resistors.

Figure 9:
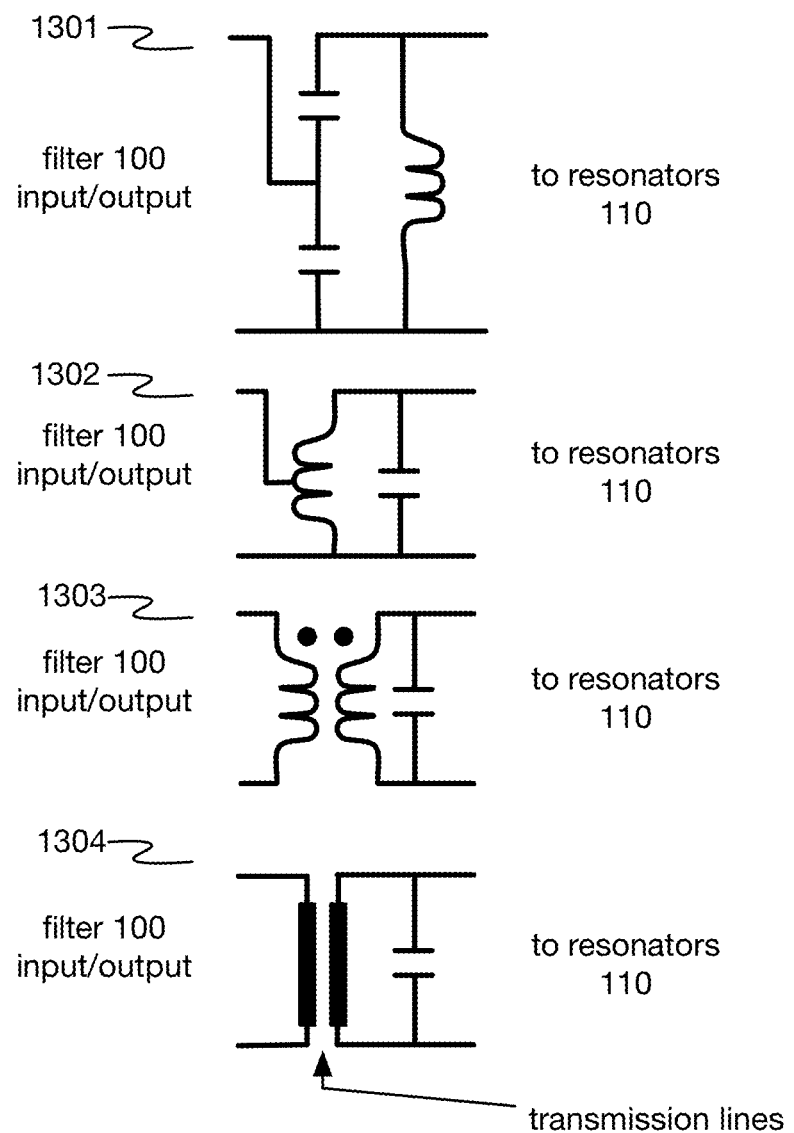
FIG. 9 is a circuit representation of input and output matching elements of a delay filter of a preferred embodiment.

Some examples of input matching elements 130 are as shown in FIG. 9. As shown in FIG. 9, example filters 100 may be coupled to using a tapped capacitor LC resonator-based coupler 1301, a tapped inductor LC resonator-based coupler 1302, an inductively-coupled LC resonator-based coupler 1303, and/or a transmission line coupler 1304.

While input matching elements 130 may be independent of LC resonators 110, additionally or alternatively, input matching elements 130 may be merged (partially or fully) with resonators 110 of the filter 100. For example, the LC resonator 110 may include an additional capacitive and/or inductive element, in parallel or in series with the primary capacitive and inductive elements, that may function as an input matching element 130.

Figure 10A:
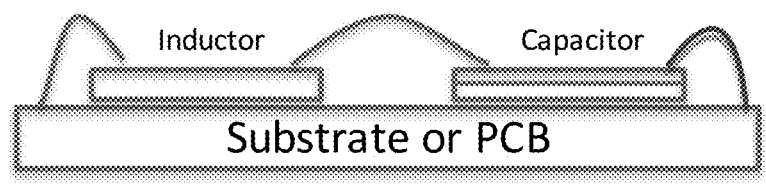
FIG. 10A is a side view representation of a delay filter of a variation of a preferred embodiment.

In a variation of a preferred embodiment, inductors and capacitors of LC resonators 110 of the delay filter 100 are separated onto separate chips, dies, and/or substrates and are coupled by wire-bonding, traces on an underlying substrate, flip-chip bonding, or some other technique. Some examples of this separation as shown in FIG. 10A and FIG. 10B.

Figure 10B:
FIG. 10B is a side view representation of a delay filter of a variation of a preferred embodiment.

Likewise, if the delay filter 100 includes switches (e.g., to switch between taps of tapped inductors/capacitors), the switches may be isolated from resonators and coupled by wire-bonding, traces on an underlying substrate, flip-chip bonding, or some other technique, as shown in FIG. 10B.

The delay filter 100 may comprise any number of switches, and switches (or a set of switches) may be any suitable components capable of selectively coupling the taps and/or coupling points of resonators 110 or other components to circuit common rails, grounds, and/or circuit inputs/outputs. For example, switches may include mechanical switches, mechanical relays, solid-state relays, transistors, silicon controlled rectifiers, triacs, and/or digital switches. Switches of the set of switches may be operable electronically by a tuning circuit or other suitable controller, but may additionally or alternatively be set in any manner. For example, switches may be manually set by a circuit user. As another example, switches may be one-time-use junctions that are configured into a desired configuration when the delay filter 100 is manufactured (e.g., by soldering, annealing, fusing, or any other suitable manner of irreversible configuration), resulting in a desired overall delay filter 100 configuration (e.g., group delay value).

Switches are preferably operable between one or more switch states, in which a state of the switch corresponds to coupling between two or more system components. For example, a switch (e.g., transistor) may be operable in a first switch state that couples a first tapping point to a coupling point of a resonator, and in a second switch state that couples a second tapping point to a coupling point of a resonator. In another example, a switch may be operable in a first switch state that couples one of a set of resonators to a common rail (e.g., a ground plane) of the system, in order to place it in the signal path of a signal passing through the time delay filter; this switch may be operable in a second switch state that decouples the resonator from the common rail, thereby removing the resonator from the signal path (and reducing the overall time delay applied by the time delay filter).

Figure 10C:
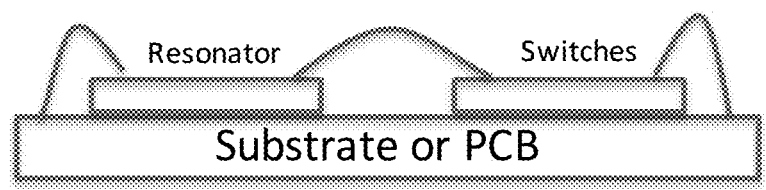
FIG. 10C is a side view representation of a delay filter of a variation of a preferred embodiment.

As shown in FIGS. 10A, 10B, and 10C, separate chips/dies may be laterally separated on a substrate, but additionally or alternatively, they may be stacked vertically (or in any other manner). Coupling between circuit elements may be between elements on either the same or separate chips. For example, inductors on a first printed circuit board may be magnetically coupled to inductors on a second printed circuit board in cases in which the two PCBs are positioned so as to bring the inductors (between which magnetic coupling is desired) into close proximity. Additionally or alternatively, other three-dimensional configurations of circuit elements may be leveraged to achieve electromagnetic coupling in any suitable manner.

In an example implementation of a preferred embodiment, the time delay filter includes a substrate and an LC resonator. The substrate is a laminated circuit board that is comprised of several layers and has two broad, substantially parallel outer surfaces (e.g., a top and bottom surface, though the substrate may be in any suitable orientation). The resonator includes a capacitive element and an inductive element, coupled together into an LC circuit that is connected in parallel between a conductive contact point (e.g., a coupling point) on the first surface and a ground plane (e.g., a conductive region) on the second surface. The inductive element is a strip inductor that is formed by a conductive region (e.g., a metallized strip) on the first surface, and connected to the capacitive element and the ground plane by a pair of conductive vias. The first via is a through-hole via passing through the substrate (e.g., through several isolative and/or conductive layers of the substrate) to the ground plane, and the second via is a partial via that passes through the substrate to an intermediate position within the substrate where the capacitive element is located. There is also a third via that passes through the substrate between the capacitive element and the ground plane, and is directly electrically connected (e.g., soldered) to both. The capacitive element, which may be a parallel plate capacitor or any other suitable capacitive element, completes the LC circuit while interrupting the continuous conductive region (e.g., by way of a dielectric barrier between two sides, such as parallel plates, of the capacitive element). Together, the strip inductor, the first, second, and third via, the capacitor, and the ground plane form a loop. This loop encloses an area that defines a normal axis, and the normal axis is substantially parallel to the plane(s) of the surfaces of the substrate; in other words, the conductive loop passes through the substrate in two locations (in this example, the locations of the vias) and lies adjacent to the substrate on two contralateral sides of the substrate.

In variations of a preferred embodiment, the LC resonators 110 may have a certain inductance and capacitance per unit length that repeats in a harmonic fashion over the length of the resonator, and the time delay filter 100 may therefore be well-represented using a distributed inductor and capacitor model (e.g., a transmission line model). In other variations, the LC resonators 110 may be formed from localized discrete components (e.g., ceramic capacitors, wound-wire inductors) such that the time delay filter 100 is well-represented using a lumped-element model. In still further variations including a plurality of LC resonators, a subset of LC resonators may be represented by a distributed model and another subset of LC resonators may be represented by a lumped element model.

Note that in many cases, the positioning of resonators relative to one another and the coupling between resonators no (whether it be capacitive, magnetic, or both) may play into the performance of the filter 100. For example, resonators may be coupled in a large horseshoe pattern (similar to the magnetic coupling of FIGS. 7A and 8A). Alternatively, resonators may be coupled in a meander pattern or a zigzag pattern (respectively), or simply in a straight pattern. Resonators no may be positioned and coupled in any manner.

Additionally the resonator itself and/or the matching resonant circuit may include fixed resistors to decrease the Q-factor and increase the bandwidth. These might alternatively be switched via the use of transistors to provide a configurability of the delay filter bandwidth.

2. Multi-Layer Fringe Capacitors

Figure 11A:
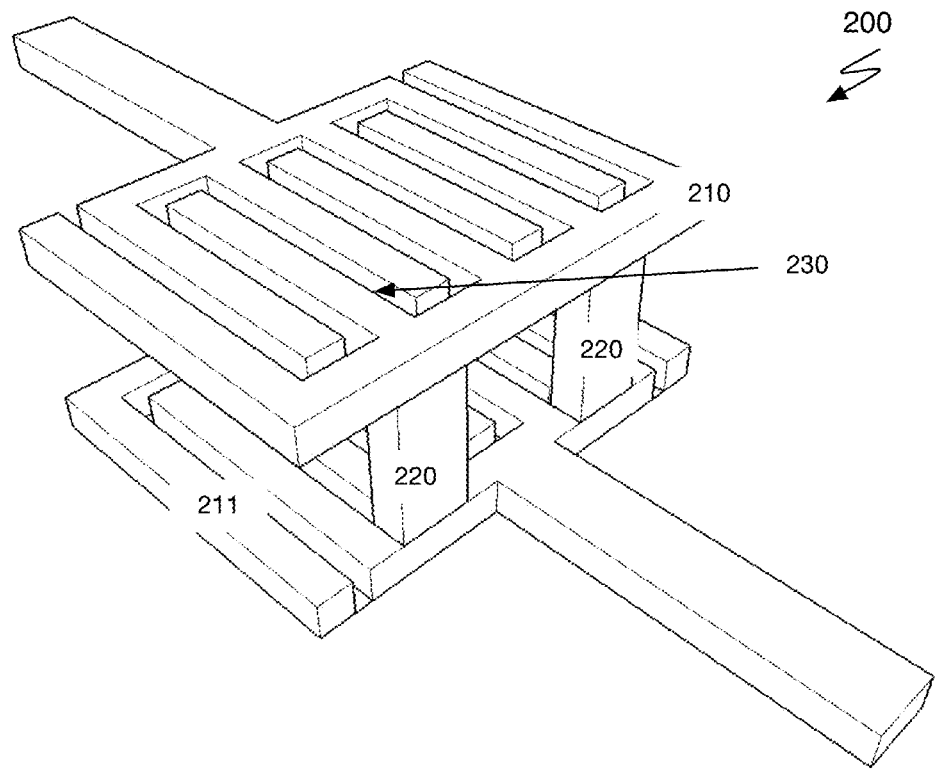
FIG. 11A is an isometric view of a multi-layer fringe capacitor of a preferred embodiment.
Figure 11B:
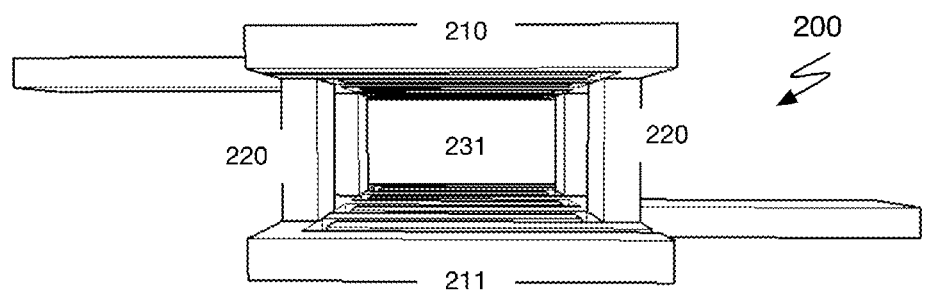
FIG. 11B is an isometric view of a multi-layer fringe capacitor of a preferred embodiment.
Figure 12:
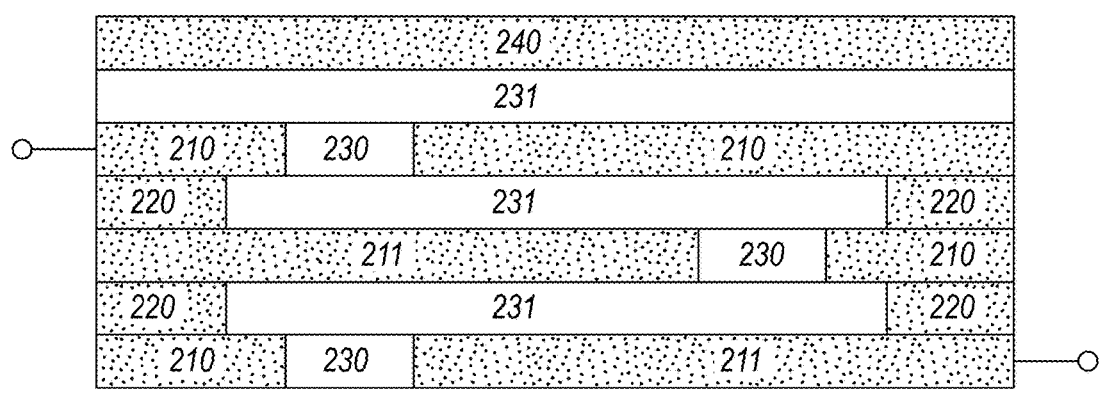
FIG. 12 is a cross-sectional view of a multi-layer fringe capacitor of a preferred embodiment.

As shown in FIGS. 11A and 11B, a multi-layer fringe capacitor 200 includes a first set of interdigitated capacitor electrodes 210, an additional set of interdigitated capacitor electrodes 211, and a set of coupling vias S220. The capacitor 200 may additionally or alternatively include an intra-layer dielectric 230, an inter-layer dielectric 231, and/or an auxiliary electrode 240 (for shielding or trimming), as shown in FIG. 12.

High quality factor (Q) LC resonators are important for a large number of circuits, including some implementations of the time delay filter 100. In particular, the use of high Q capacitors and inductors may enable circuits such as the time delay filter 100 to reduce insertion loss and ripple across operating bands. In this function, the multi-layer fringe capacitor may be used as the primary capacitor in the resonator or as an auxiliary capacitor predominantly to increase the Q-factor of a parallel plate capacitor.

The multi-layer fringe capacitor 200 preferably functions to provide a high Q source of capacitive reactance to a circuit (e.g., the time delay filter 100) while maintaining a compact footprint compatible with laminate and/or chip-based fabrication techniques.

Figure 13:
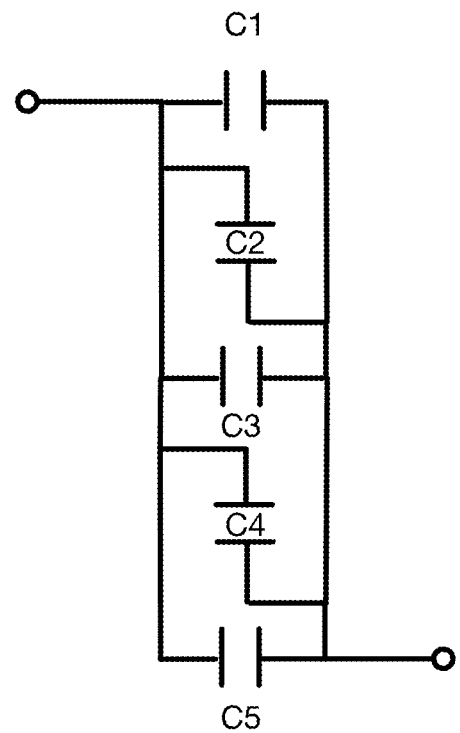
FIG. 13 is a circuit schematic view of a multi-layer fringe capacitor of a preferred embodiment.
Figure 13:
Figure 13:
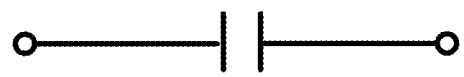

The compact footprint of the multi-layer fringe capacitor 200 is preferably enabled by the capacitor electrodes being coupled both intra-layer (e.g., the first electrode of the first set of electrodes 210 is capacitively coupled to the second electrode of the first set of electrodes 210, which are interdigitated and within a same plane) and through-layer (e.g., the first set of electrodes 210 are capacitively coupled with the additional set of electrodes 211). As shown in FIG. 13, the intra-layer and inter-layer capacitances may be combined to increase overall capacitance given appropriate coupling of layers via the coupling vias 220. Alternatively stated, $$C_{total} = nC_{intra-layer} + (n-1)C_{inter-layer}$$

where n is the number of layers (assuming identical intra- and inter-layer capacitances across layers). More generally stated, the total capacitance is preferably approximately the sum of the intra- and inter-layer capacitances. Alternatively, the total capacitance may be any combination (e.g., parallel, serial) of intra- and inter-layer capacitances (including parasitic capacitances, the contribution of the auxiliary electrode 240, etc.) or any other value.

The first set of interdigitated capacitor electrodes 210 functions to provide an intra-layer contribution to the capacitance of the multi-layer fringe capacitor 200. Each of the first set of interdigitated capacitor electrodes 210 is preferably fully constructed from a single patterned metallization layer of a laminate (e.g., a copper metallization layer of a printed circuit board), thus sharing a plane; additionally or alternatively, the first set of interdigitated capacitor electrodes 210 may be constructed in any manner using any conductive material.

Given the nature of laminate fabrication, the first set of interdigitated capacitor electrodes 210 preferably has a uniform thickness substantially equal to the thickness of the metallization layer of the laminate in which the first set of interdigitated capacitor electrodes 210 is located. Additionally or alternatively, the first set of interdigitated capacitor electrodes 210 may have a uniform thickness different than that of the rest of the metallization layer (e.g., the electrodes 210 are partially etched away), or may have a non-uniform thickness.

Figure 14A:
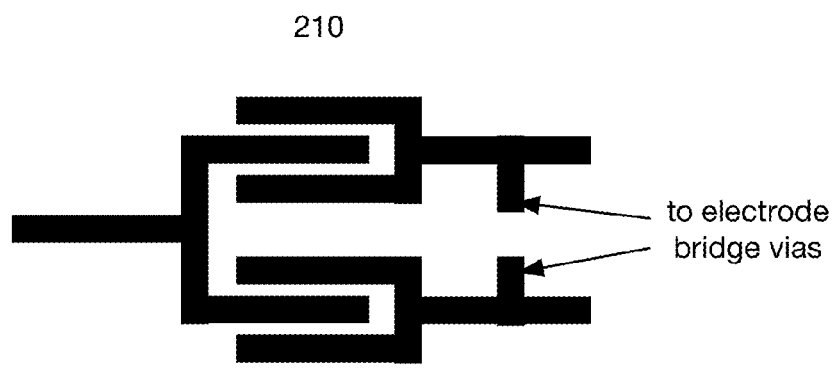
FIG. 14A is a top-down view of a first set of capacitor electrodes of a multi-layer fringe capacitor of a preferred embodiment.
Figure 14B:
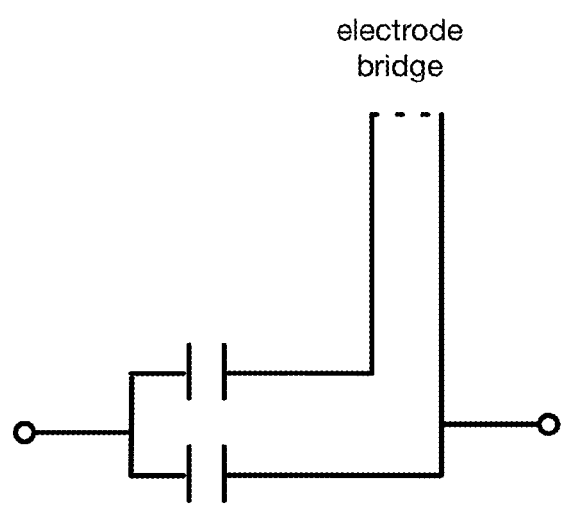
FIG. 14B is a circuit schematic view of a first set of capacitor electrodes of a multi-layer fringe capacitor of a preferred embodiment.

The first set of interdigitated capacitor electrodes 210 preferably includes two electrodes, as shown in FIGS. 11A, 11B, and 12; additionally or alternatively, the first set of interdigitated capacitor electrodes 210 may include more than two electrodes. For example, the first set of interdigitated capacitor electrodes 210 may include three or more electrodes, as shown in FIG. 14A. The electrodes of the first set 210 may be connectable in any way. For example, some of the electrodes 210 may be connectable using an electrode bridge; that is, a conductive element that selectively shorts the electrodes 210. The electrode bridge may be on the same layer of the first set 210, but may additionally or alternatively be connected through vias to another layer of a laminate. Such a bridge, may, for example, be coupled to a switching layer (e.g., allowing the electrode bridge to be switched between closed and open states). As a second example, the electrode bridge may be coupled using a metallization strip on the exterior of the laminate, enabling the strip to be left alone (e.g., shorted bridge) or selectively milled/etched/laser cut or ablated (e.g., open bridge). As a third example, the bridge may be left open by default, and may be bridgeable using additional conductive material (e.g., solder balls).

Electrodes of the first set of interdigitated capacitor electrodes 210 preferably are interdigitated; that is, an electrode of the first set 210 comprise a number of high in-plane aspect ratio (e.g., much longer than wide) electrode 'fingers' that are meshed with fingers of another electrode of the first set 210. Electrode finger aspect ratio is preferably one or greater and more preferably five or greater, but may additionally or alternatively be any number. The electrodes may be of any size and shape, and may be separated by any distance (or set of distances) from other electrodes of the first set 210.

Interdigitation of the electrodes may serve two purposes; one is that interdigitated electrodes may lead to high surface areas of intra-layer capacitive coupling for a given metallization layer area (e.g., high capacitance to electrode footprint ratio), another is that interdigitated electrodes may also have high inter-layer capacitive coupling surface areas. These two purposes allow the fabrication of capacitors 200 that are both space-efficient and high in quality factor (Q).

Figure 15:
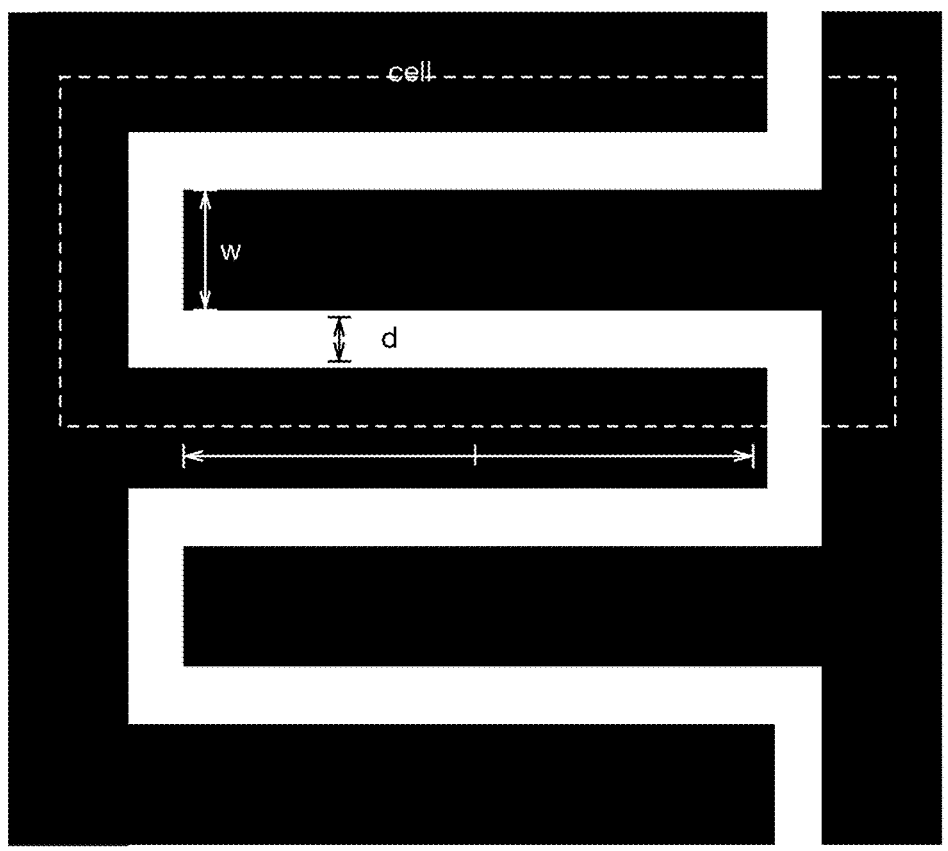
FIG. 15 is a top-down view of a set of capacitor electrodes of a multi-layer fringe capacitor of a preferred embodiment.

The intra-layer capacitance is a function of the spacing between electrodes, the thickness of the metallization layer, and the length, width, and number of interdigitated electrode fingers and any intra-layer dielectric 230. Assuming a structure as shown in FIG. 15 having uniform proportions and dielectric constants, an approximate first order model (treating the interdigitated model as a set of parallel plate capacitors, ignoring capacitive coupling in corners) can be constructed giving the following capacitance:

$$C = n\frac{2\epsilon}{d} * [wt + lt]$$

where n is the number of 'cells', $\in$ is the dielectric constant of the intra-layer dielectric 230, t is the thickness of the metallization layer, and w, l, and d are as shown in FIG. 15. While such a model is only roughly accurate, it may be used to get a feel for how the dimensions of a uniform interdigitated capacitor affect the intra-layer capacitance of such a capacitor. In this example, the coupling area (i.e., the area where one electrode is close to another, as opposed to traces or features of one electrode far away from others) of the intermeshed electrodes is formed by a set of repeated adjacent cells, each cell including a rectangular finger electrode and a u-shaped receptacle electrode.

In a variation of a preferred embodiment, the first set of capacitor electrodes 210 is not interdigitated. In this variation, the first set of capacitor electrodes 210 may include any number of conductive electrodes (preferably, but not necessarily, two or more) arranged and shaped in any manner (e.g. as a single plate, acting as a shield to the outside of the capacitor).

The additional set of interdigitated capacitor electrodes 211 is preferably substantially similar to the first set of interdigitated capacitor electrodes 210, but may additionally or alternatively be any suitable set of interdigitated capacitor electrodes.

The capacitor 200 may include any number of additional sets 211; for example, as shown in FIG. 12, the capacitor 200 may include two sets 211.

The first set of capacitor electrodes 210 and additional set 211 are preferably separated by a uniform thickness inter-layer dielectric 231. Alternatively, the first set and the additional set 211 may be separated by any material of any thickness (uniform or non-uniform).

Figure 16A:
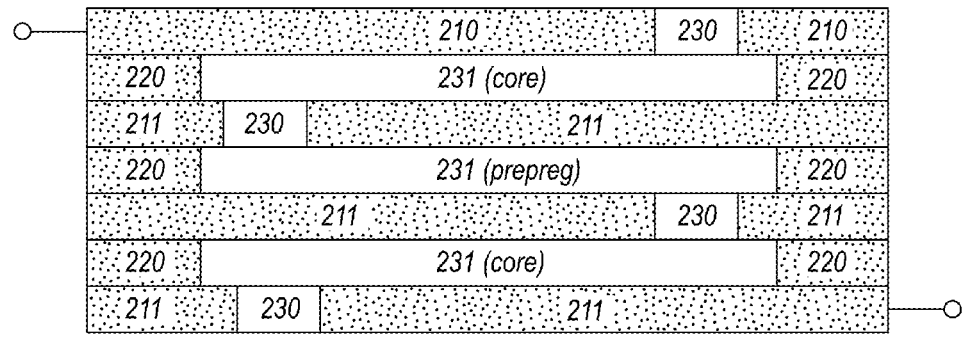
FIG. 16A is a cross-sectional view of a multi-layer fringe capacitor of a preferred embodiment.

If fabricated in a laminate process, the capacitor 200 may be fabricated using a set of metal-clad core layers, which are sandwiched together under heat and pressure using pre-preg layers. The core layer insulator may have substantially different electrical properties than the pre-preg (or other bonding) material. Resultantly, it may be desired that sets of electrodes 210 and 211 be separated in a number of manners to provide a desired electrical result. In a first example, as shown in FIG. 16A, it may be desired for electrodes separated by both pre-preg and core layers to contribute significantly to the capacitance of the capacitor 200. In the first example, since the thickness of pre-preg and core layers is similar, the capacitor 200 includes three significant inter-layer capacitances, one proportional to the pre-preg dielectric constant, and two proportional to the core dielectric constant. Note that in this example, the intra-layer dielectric may also be pre-preg material (alternatively, it may be a dielectric deposited prior to sandwiching using the pre-preg).

Figure 16B:
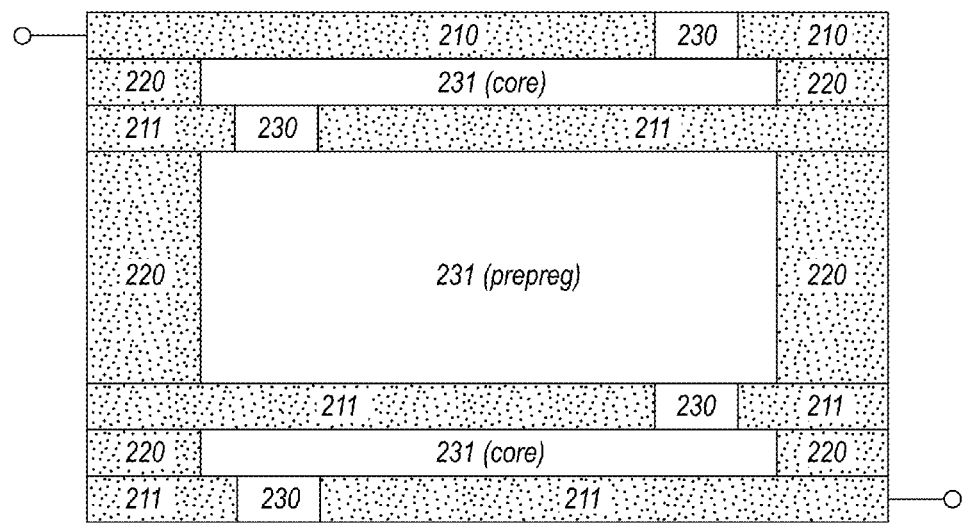
FIG. 16B is a cross-sectional view of a multi-layer fringe capacitor of a preferred embodiment.

In a second example, as shown in FIG. 16B, it may be desired to minimize inter-layer capacitances occurring in pre-preg material (or, vice versa, in core material). This may occur if pre-preg material is substantially lossier (or otherwise less suitable for capacitor performance) than core material. In this example, the prepreg material is much thicker than the core material, and the capacitance coupled through the pre-preg layer is substantially smaller than the capacitance coupled through core layers.

Figure 16C:
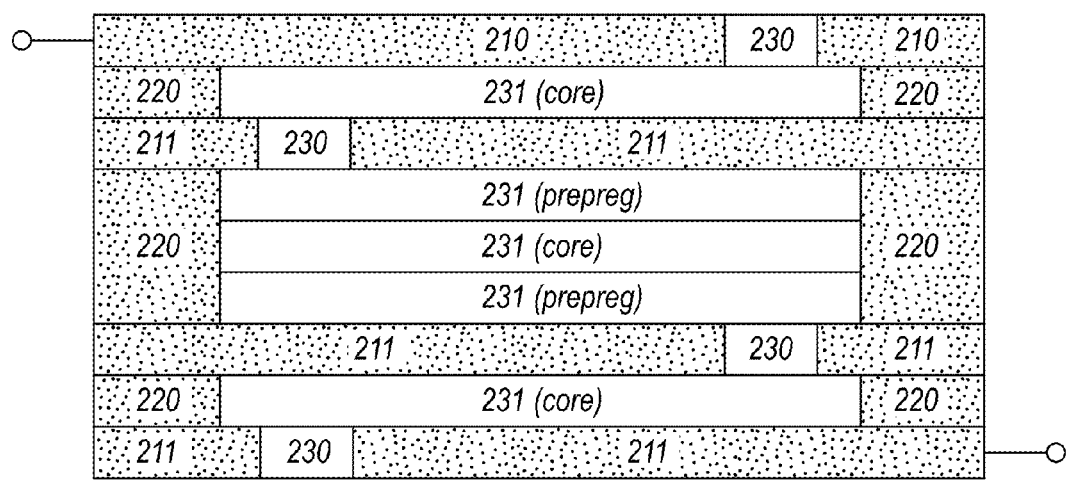
FIG. 16C is a cross-sectional view of a multi-layer fringe capacitor of a preferred embodiment.

In a third example, in addition to simply using a thicker pre-preg layer, the capacitor 200 may include additional non-metallized core layers (i.e., the core layer is not metallized in the area of the capacitor 200), as shown in FIG. 16C.

Figure 18A:
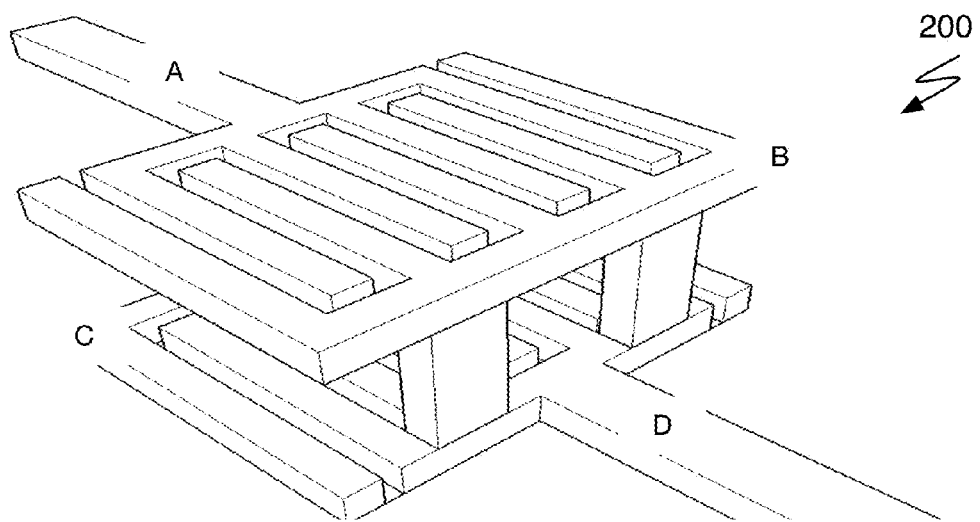
FIG. 18A is an isometric view of a multi-layer fringe capacitor of a preferred embodiment.
Figure 18B:
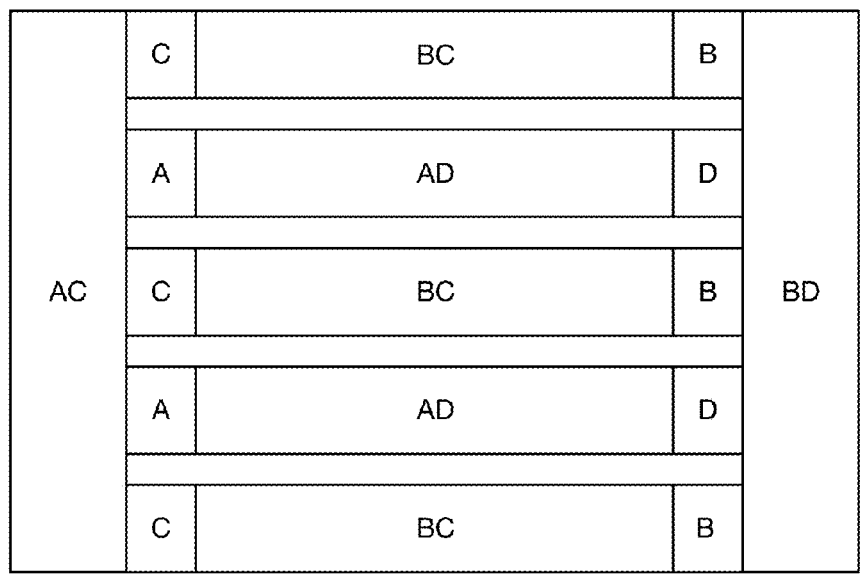
FIG. 18B is an electrode region overlap view of a multi-layer fringe capacitor of a preferred embodiment.

As shown in FIGS. 11A, 12 and 16A-16C, electrodes of the first and second set of electrodes are preferably arranged such that inter-layer capacitive coupling occurs perpendicular to layers separating the electrodes, reducing the distance between electrodes on different layers intended to be coupled capacitively (e.g., as opposed to shorted by coupling vias 220). In the case of interdigitated electrodes, this may be accomplished by rotating electrodes 180 degrees between layers, such that the majority of the area of one electrode in a first layer is directly over its counterpart electrode (i.e., the electrode through which inter-layer coupling primarily occurs, as opposed to an electrode shorted to the one electrode through a coupling via 220). This effect may be more generally described in the following manner: for a first set of interdigitated electrodes A and B, positioned within a first plane, and a second set of interdigitated electrodes C and D, positioned with a second plane parallel to the first, a superposition of the two planes forms two types of regions; those where the region defined by one electrode overlaps the region defined by one other, and those where the region defined by one electrode does not overlap the region of any other. Note that this example assumes there is an overlap and that in-plane electrodes do not overlap, neither of which are required by electrodes of the capacitor 200. Assuming that A and C are shorted, and B and D are shorted (as in FIG. 18A), it may be desired to provide for increased coupling between electrodes A and D, and between electrodes B and C. Electrode area overlap may be used as proxy for increasing this capacitive coupling. As shown in FIG. 18B, after superposition, the regions as shown result for a structure similar to that of FIG. 18A. The overall area of the electrodes is the sum of all regions shown. Region AC, for example, is a region where electrodes A and C overlap, while Region C is a region where electrode C is present but no other electrode overlaps. In one example implementation of the capacitor 200, the fraction of area in which non-shorted electrodes (e.g., A and D, B and C) overlap is preferably more than 50% of total electrode area and more preferably more than 80% of total electrode area, but may additionally or alternatively be any value. Alternatively stated, the sum of the intersection of regions A and D and the intersection of regions B and C is preferably greater than 50% of the union of regions A, B, C, and D.

Additionally or alternatively, electrode positioning, size, shape, rotation, or any other quality may be modified in any manner between layers (or may not be modified at all).

The coupling vias 220 function to couple electrodes of first and additional electrode sets 210/211 to each other, enabling the parallel connection of multiple intra-layer capacitances. The coupling vias 220 preferably do not substantially affect inter-layer capacitances, but may additionally or alternatively be fabricated to affect inter-layer capacitances (e.g., if the vias 220 are close to counterpart electrodes, they may themselves be capacitively coupled to those counterpart electrodes). For example, the contribution to total capacitance of electrodes shorted by the coupling vias 220 is preferably less than ten percent of overall capacitance of the capacitor 200 and more preferably less than one percent, but may alternatively be any value. The coupling vias 220 are preferably the same conductive material as the metallization layer used to form the capacitor electrodes 210/211 but may additionally or alternatively be any suitable conductive material.

Figure 17:
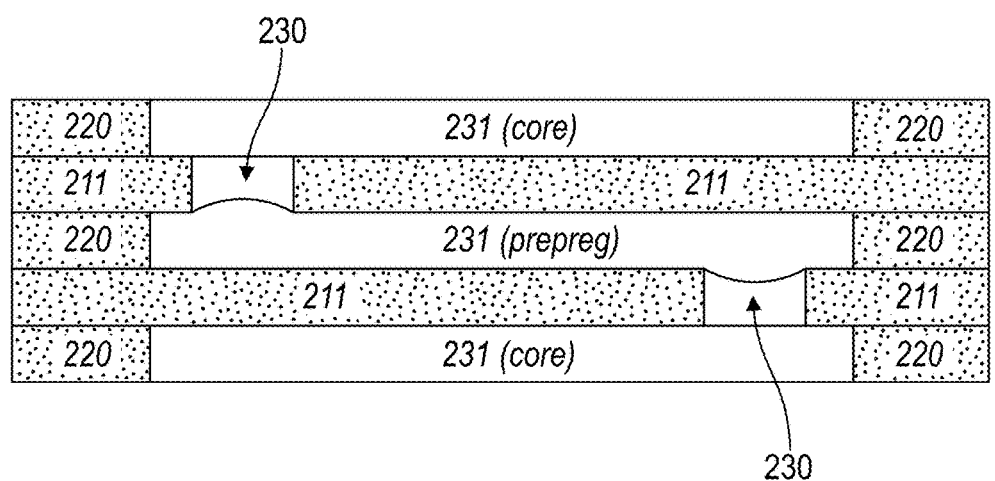
FIG. 17 is a cross-sectional view of a multi-layer fringe capacitor of a preferred embodiment.

The intra-layer dielectric 230 functions as an insulative material between electrodes of the first set of electrodes 210 and/or between electrodes of an additional set of electrodes 211. The intra-layer dielectric 230 may be any suitable insulative material, including air. Alternatively, the intra-layer dielectric 230 may not be present (i.e., there is a vacuum between intra-layer counterpart electrodes). In one example, the intra-layer dielectric 230 is formed from pre-preg material. In a second example, the intra-layer dielectric 230 is formed from a high-k dielectric material deposited after metallization layer patterning (or at any other time). In a third example, the intra-layer dielectric 230 is a gas or vacuum pocket formed deliberately or by failure of the pre-preg material to fully occupy the intra-electrode space, as shown in FIG. 17.

The inter-layer dielectric 231 functions as an insulative material between electrodes of one layer (e.g., the first set 210) and of another layer (e.g., the additional set 211). The inter-layer dielectric 231 may be of any insulative material, and as shown in FIGS. 16A-C and described previously, may vary in composition and/or structure from layer to layer.

The auxiliary electrode 240 functions to provide shielding of the capacitor (e.g., towards outside higher loss materials) and/or an ability to tune the capacitance of the multi-layer fringe capacitor 200. The auxiliary electrode is preferably located at or near the surface of the laminate or chip substrate of the multi-layer fringe capacitor 200 (e.g., may be an exposed outer layer, may be protected by a passivation layer).

The auxiliary electrode 240 preferably provides an addition to the capacitance of the capacitor 200 that may be modified by selectively removing (e.g., via laser ablation, milling, grinding, etching, etc.) areas of the electrode 240. Thus, the capacitance of the capacitor 200 can be tuned after primary fabrication (e.g., to create easily varied capacitors using the same manufacturing process and/or to address for undesired capacitance variation that results from the fabrication process). Such tuning preferably occurs while measuring capacitance of the capacitor 200 (either simultaneously or in iterative steps of modifying the electrode and checking the capacitance). The electrode 240 is preferably composed of the same metal used in the metallization layers, but may additionally or alternatively be any conductive material. The electrode 240 may also provide tuning in any other manner; for example, a DC (or AC) voltage may be coupled to the electrode. Such a voltage may be static (e.g., always 2V DC) or variable.

Note that solder stop/mask material may be detrimental to performance of the capacitor 200. Resultantly, the capacitor 200 is preferably passivated without use of solder stop/mask material, but the capacitor 200 may additionally or alternatively be passivated in any manner.

Figure 19A:
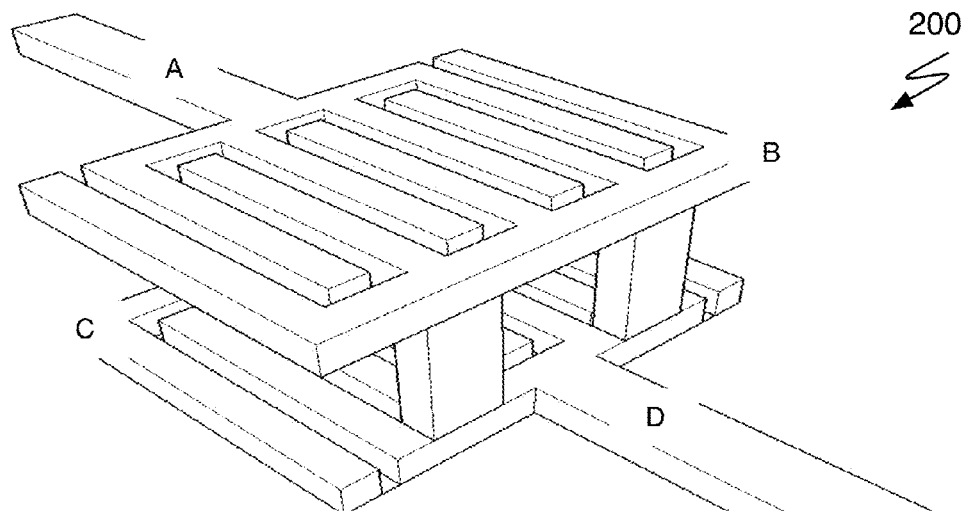
FIG. 19A is an isometric view of a multi-layer fringe capacitor of a preferred embodiment.
Figure 19B:
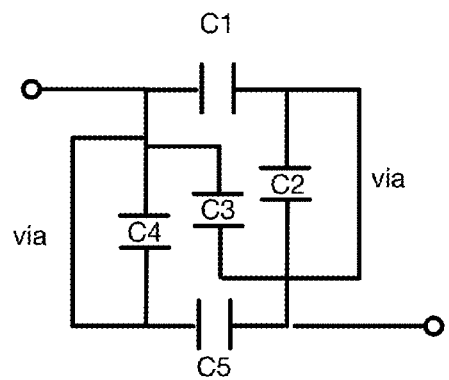
FIG. 19B is a circuit schematic view of a multi-layer fringe capacitor of a preferred embodiment.
Figure 19B:
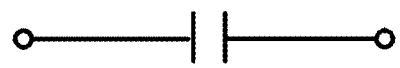

An example two-layer capacitor 200, having a first set of interdigitated electrodes A and B and a second set C and D, is as shown in FIG. 19A. As shown in FIG. 19B, some of the capacitances created by this structure are as follows: C1 (resulting from capacitive coupling between electrodes A and B), C2 (resulting from capacitive coupling between electrodes B and D), C3 (resulting from capacitive coupling between electrodes A and D), C4 (resulting from capacitive coupling between electrodes A and C), and C5 (resulting from capacitive coupling between electrodes C and D). As previously stated, the contribution of electrodes coupled by vias 220 (in this example, C2 and C4) is preferably less than ten percent and more preferably less than one percent of the overall capacitance. Alternatively, capacitors may make any contribution to the total capacitance.

As a person skilled in the art will recognize from the previous detailed description and from the figures and claims, modifications and changes can be made to the preferred embodiments of the invention without departing from the scope of this invention defined in the following claims.

We claim:

1. A multilayer fringe capacitor comprising:
   first and second interdigitated capacitor electrodes, both parallel to and intersecting a first planar surface; wherein the first electrode defines a first region within the first planar surface and the second electrode defines a second region within the first planar surface;
   third and fourth interdigitated capacitor electrodes, both parallel to and intersecting a second planar surface, the second planar surface parallel to and separated by a non-zero distance from the first planar surface; wherein the third electrode defines a third region within the second planar surface and the fourth electrode defines a fourth region within the second planar surface;
   a first set of coupling vias that electrically couples the first electrode to the third electrode; and
   a second set of coupling vias that electrically couples the second electrode to the fourth electrode;
   wherein, upon superimposing the first planar surface upon the second planar surface, the sum of the intersection of the first and fourth regions and the intersection of the second and third regions is greater than fifty percent of the union of the first, second, third, and fourth regions; wherein the multilayer fringe capacitor comprises first, second, and third layers; wherein the first layer comprises the third and fourth electrodes; wherein the second layer, directly above the first layer, comprises the first and second sets of coupling vias; wherein the third layer, directly above the second layer, comprises the first and second electrodes; further comprising a fourth layer, directly above the third layer, the fourth layer comprising an insulative material covering the first and second electrodes; further comprising a fifth layer, directly above the fourth layer, the fifth layer comprising an auxiliary electrode; wherein the auxiliary electrode is coupled to a variable DC bias; wherein the variable DC bias is changed to alter a capacitance of the multilayer fringe capacitor.

2. The multilayer fringe capacitor of claim 1, wherein, upon superimposing the first planar surface upon the second planar surface, the sum of the intersection of the first and fourth regions and the intersection of the second and third regions is greater than eighty percent of the union of the first, second, third, and fourth regions.

3. The multilayer fringe capacitor of claim 1, having a total capacitance measured between a point on the first electrode and a point on the fourth electrode, wherein capacitance resulting from coupling between the first and third electrodes and coupling between the second and fourth electrodes contributes less than ten percent to the total capacitance.

4. The multilayer fringe capacitor of claim 3, wherein capacitance resulting from coupling between the first and third electrodes and coupling between the second and fourth electrodes contributes less than one percent to the total capacitance.

5. The multilayer fringe capacitor of claim 1, wherein the first and second electrodes have intermeshed rectangular electrode fingers; wherein a first coupling area of the first and second electrodes comprises a first plurality of identical and adjacent cells, each cell of the first plurality including a rectangular electrode finger coupled to the first electrode and a u-shape receptacle electrode.

6. The multilayer fringe capacitor of claim 5, wherein the third and fourth electrodes have intermeshed rectangular electrode fingers; wherein a second coupling area of the third and fourth electrodes comprises a second plurality of identical and adjacent cells, each cell of the second plurality including a rectangular electrode finger coupled to the first electrode and a u-shape receptacle electrode; wherein cells of the first plurality are mirror images of cells of the second plurality.

7. The multilayer fringe capacitor of claim 6, wherein the rectangular electrode fingers of the cells of the first and second pluralities have aspect ratios greater than one.

8. The multilayer fringe capacitor of claim 6, wherein the rectangular electrode fingers of the cells of the first and second pluralities have aspect ratios greater than five.

9. The multilayer fringe capacitor of claim 1, wherein structure of the auxiliary electrode is defined by a removal of material; wherein the removal of material is simultaneous or in iteration with capacitance measurements of the multilayer fringe capacitor, such that the removal of material changes a capacitance of the multilayer fringe capacitor from an initial value to a desired value, different from the initial value.

10. The multilayer fringe capacitor of claim 1, wherein the multilayer fringe capacitor is constructed from laminate; wherein the first layer further comprises insulative prepreg material separating the third and fourth electrodes; wherein the second layer further comprises insulative core material separating the first and second sets of vias; wherein the third layer further comprises insulative prepreg material separating the first and second electrodes.

11. The multilayer fringe capacitor of claim 1, wherein the multilayer fringe capacitor is constructed from laminate; wherein the first layer further comprises air separating the third and fourth electrodes; wherein the second layer further comprises insulative core material separating the first and second sets of vias; wherein the third layer further comprises air separating the first and second electrodes.

12. A multilayer fringe capacitor comprising:
first, second, and third capacitor electrodes, all parallel to and intersecting a first planar surface; wherein the first electrode defines a first region within the first planar surface, the second electrode defines a second region within the first planar surface, and the third electrode defines a third region within the first planar surface; wherein the first electrode is interdigitated with both of the second and third capacitor electrodes; wherein the second and third sets of electrodes are electrically coupled by solder;
fourth, fifth, and sixth capacitor electrodes, all parallel to and intersecting a second planar surface, the second planar surface parallel to and separated a non-zero distance from the first planar surface; wherein the fourth electrode defines a fourth region within the second planar surface, the fifth electrode defines a fifth region within the second planar surface, and the sixth electrode defines a sixth region within the second planar surface; wherein the fourth electrode is interdigitated with both of the fifth and sixth capacitor electrodes;
a first set of coupling vias that electrically couples the first electrode to the fourth electrode;
a second set of coupling vias that electrically couples the second electrode to the fifth electrode; and
a third set of coupling vias that electrically couples the third electrode to the sixth electrode.

13. A time delay filter comprising:
a substrate comprising a first isolative layer, the first isolative layer comprising a first surface and a second surface, the second surface substantially parallel to the first surface;
a resonator, comprising a capacitive element coupled to an inductive element, the inductive element comprising:
a first conductive region coupled to the first surface of the first isolative layer,
a second conductive region coupled to the second surface of the first isolative layer,
a first via that is electrically coupled to and extends between the first and second conductive region;
a second via that is electrically coupled to and extends between the first conductive region and a first portion of the capacitive element; and
a third via that is electrically coupled to and extends between the second conductive region and a second portion of the capacitive element; wherein the first conductive region, the first via, the second conductive region, the second via, the capacitive element, and the third via form a loop;
a first coupling point, electrically coupled to the first conductive region of the resonator; and
a second coupling point, electrically coupled to the second conductive region of the resonator; wherein the capacitive element comprises:
first and second interdigitated capacitor electrodes, both parallel to and intersecting a third surface; wherein the first electrode defines a first capacitor region within the third surface and the second electrode defines a second capacitor region within the third surface;
third and fourth interdigitated capacitor electrodes, both parallel to and intersecting a fourth surface, the fourth surface parallel to and separated by a non-zero distance from the third surface; wherein the third electrode defines a third capacitor region within the fourth surface and the fourth electrode defines a fourth capacitor region within the fourth surface;
a first set of capacitor coupling vias that electrically couples the first electrode to the third electrode; and
a second set of capacitor coupling vias that electrically couples the second electrode to the fourth electrode;
wherein, upon superimposing the third surface upon the fourth surface, the sum of the intersection of the first and fourth capacitor regions and the intersection of the second and third capacitor regions is greater than fifty percent of the union of the first, second, third, and fourth capacitor regions.

* * * * *